United States Patent [19]

Przybysz et al.

[11] Patent Number: 5,140,324
[45] Date of Patent: Aug. 18, 1992

[54] SUPERCONDUCTING SIGMA-DELTA ANALOG-TO-DIGITAL CONVERTER

[75] Inventors: John X. Przybysz, Penn Hills; Donald L. Miller, Penn Township, Westmoreland County, both of Pa.; Eric H. Naviasky, Baltimore, Md.

[73] Assignee: Westinghouse Electric Corp., Pittsburgh, Pa.

[21] Appl. No.: 710,856

[22] Filed: Jun. 6, 1991

[51] Int. Cl.$^5$ .............................................. H03M 3/00
[52] U.S. Cl. .................................. 341/133; 341/143
[58] Field of Search ...................... 341/133, 143, 171

[56] References Cited

U.S. PATENT DOCUMENTS

| | | | |
|---|---|---|---|
| 4,315,255 | 2/1982 | Harris et al. | 341/133 |
| 4,509,037 | 4/1985 | Harris | 341/143 |
| 4,646,060 | 2/1987 | Phillips et al. | 341/133 |
| 4,983,971 | 1/1991 | Przybysz et al. | 341/133 |
| 5,039,989 | 8/1991 | Welland et al. | 341/143 |

OTHER PUBLICATIONS

James C. Candy, A Use of Limit Cycle Oscillations to Obtain Robust Analog-To-Digital Converters, IEEE Transactions on Communications, Mar. 1974.

James C. Candy, et al., Using Triangularly Weighted Interpolation to Get 13-Bit PCM from a Sigma-Delta Modulator, IEEE Transactions on Communications, Nov. 1976.

Steven R. Norsworthy et al., A 14-Bit 80-kHz Sigma-Delta A/D Converter: Modeling, Design, and Performance Evaluation, IEEE Journal of Solid State Circuits, vol. 24, No. 2, Apr. 1989.

V. K. Kaplunenko, et al., Experimental Study of the RSFQ Logic Elements, IEEE Trans. on Magn., vol. MAG-25, pp. 861-864 Mar. 1989.

Konstantin K. Likharev, Progress and Prospects of Superconductor Electronics, Supercond. Sci. Technol. 3 (1990) 325-337, printed in the UK.

*Primary Examiner*—Marc Hoff
*Attorney, Agent, or Firm*—R. P. Lenart

[57] ABSTRACT

A superconducting sigma-delta analog-to-digital converter utilizes a superconducting inductor as the integrator and a Josephson junction connected in series between the inductor and ground as the quantizer. A SQUID generates sampling pulses at a selected GHz frequency which add to the inductor current flowing through the Josephson junction. When the combined current through the Josephson junction exceeds the critical current of the Josephson junction, a voltage pulse is generated which kicks back into the inductor to reduce the inductor current. The voltage across the Josephson junction is, therefore, a one bit digital representation of the analog signal. This one bit digital signal is converted to a multi-bit digital signal preferably by a decimator having superconducting circuits which reduce the frequency of the multi-bit digital signal to a frequency which can be further processed by semiconductor processors. Preferably, a weighting function is utilized in a conversion to improve accuracy.

13 Claims, 2 Drawing Sheets

SUPERCONDUCTING SIGMA-DELTA ANALOG-TO-DIGITAL CONVERTER

BACKGROUND OF THE INVENTION

1. Field of the Invention

This invention relates to analog-to-digital converters and, more particularly, to a sigma-delta type analog-to-digital converter constructed from superconducting devices operating at gigahertz frequencies.

2. Background Information

Conventional analog-to-digital (A/D) converters repetitively sample and hold the analog signal for application to a series of comparators and or analog processors. In such converters, at least one and in some cases as many as $2^n$ (where n is the number of bits) precision analog circuits are required to produce the digital output signal. Furthermore, these conventional A/D converters produce a significant quantization error in the least significant bit and may sacrifice other parameters such as speed, power, weight, or life characteristics.

An improved type of A/D converter known as the sigma-delta A/D converter utilizes an integrator to which the analog signal is applied, a single rough quantizer operating at high speed to convert the output of the integrator to a single bit digital signal, a digital filter which converts the high speed single bit output of the quantizer into a multi-bit digital output, and a feedback loop including the quantizer, a digital-to-analog converter and the integrator. The quantizer samples the integrator output at a rate many times the Nyquist rate. The resolution of the digital signal is a function of the oversampling rate of the quantizer.

Typically, sigma-delta converters have been implemented in integrated circuits with sampling rates of about 3 MHz, although there have been reports of devices operating at 60-80 MHz. Sampling at 3 MHz on a 500 Hz signal produces a 17 bit digital output signal at the Nyquist rate. With 80 MHz sampling 24 bit resolution of the 500 Hz signal could be achieved. The feedback in the sigma-delta converter integrates the error in the least significant digit thereby shifting the noise to higher frequencies above the fundamental frequency of the analog input signal. The chief advantage of the presently available sigma-delta converters is that they substitute high speed digital signal processing for high-precision analog circuits.

A converter utilizing a superconducting quantum interference device (SQUID) to generate pulses at frequencies of up to 30 GHz for an analog-to-digital conversion has been suggested. The SQUID incorporates Josephson junctions which generate a single flux quantum (SFQ) pulse train that is used to clock a series of superconducting flip-flops. A separate superconducting flip-flop is required for each digit of the digital output signal. As in the case of the conventional analog-to-digital circuit which it resembles, this converter has significant quantization error in the least significant bit.

High-dynamic range analog-to-digital converters are important in surveillance radar, signal interception, medical imaging and focal plane array applications.

There is a need for improved analog-to-digital for these applications and others.

More particularly, there is a need for analog-to-digital converters with improved dynamic range.

There is also a need for analog-to-digital converters with improved accuracy.

There is a further need for improved analog-to-digital converters which do not require extensive precision analog circuitry.

SUMMARY OF THE INVENTION

These and other needs are satisfied by the present invention which is directed to an improved sigma-delta analog-to-digital converter with a sampling rate in the GHz range. More particularly, it is directed to a superconducting analog-to-digital converter with a sigma-delta modulator which uses a Josephson junction as the quantizer and a superconducting inductor as the integrator. Sampling pulses generated by a SQUID are added to the inductor current which flows through the Josephson junction. On sampling pulses for which the critical current of the Josephson junction is exceeded, a voltage pulse is generated. No voltage pulses are generated by sampling pulses which when added to the inductor current do not cause the critical current of the Josephson junction to be exceeded. Thus, the response of the Josephson junction to the sampling pulses and the inductor current represents a single-bit digital signal having a one value for pulses for which the critical current is exceeded and a zero value for other sampling pulses.

The voltage pulses produced when the critical current of the Josephson junction is exceeded, also provide feedback which reduces the inductor current. Each pulse is the size of a flux quantum. Thus, the feedback is very stable and accurate. The time average of the voltage pulses fed back by the Josephson junction is equal to the time average of the voltage of the applied analog signal.

The superconducting sigma-delta A/D converter of the invention further includes a digital filter which converts the single-bit digital signal produced by the Josephson junction into a multi-bit digital output signal. The over-sampling rate determines the resolution of this digital output signal.

The sampling pulses are generated by a SQUID at a rate of at least about one GHz and preferably 10's of GHz. The filter which produces the multi-bit output from the single bit output of the sampling junction is preferably a decimator. Preferably, a weighting function is applied to the decimation to improve the accuracy of the conversion. The decimator includes superconducting components capable of operating at the GHz frequencies of the superconducting sigma-delta modulator and reduces the sampling rate to MHz rates which can be further reduced by semi-conductor processors to the Nyquist rate.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
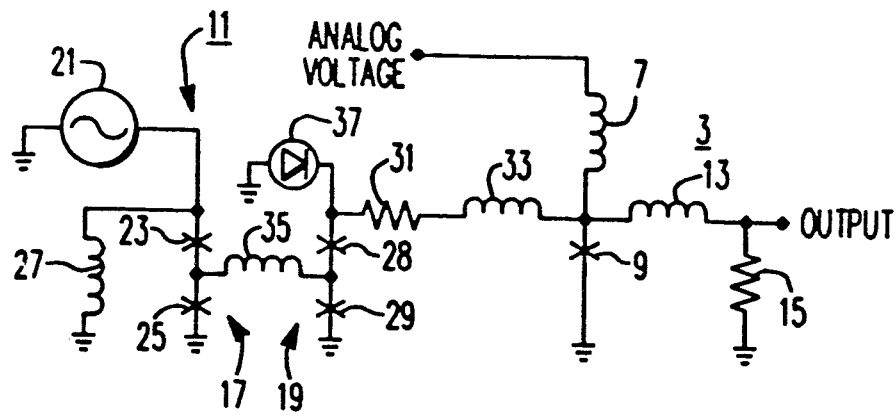
FIG. 1 is a schematic diagram of a superconducting sigma-delta modulator forming a part of an A/D converter constructed in accordance with the invention.
Figure 5:
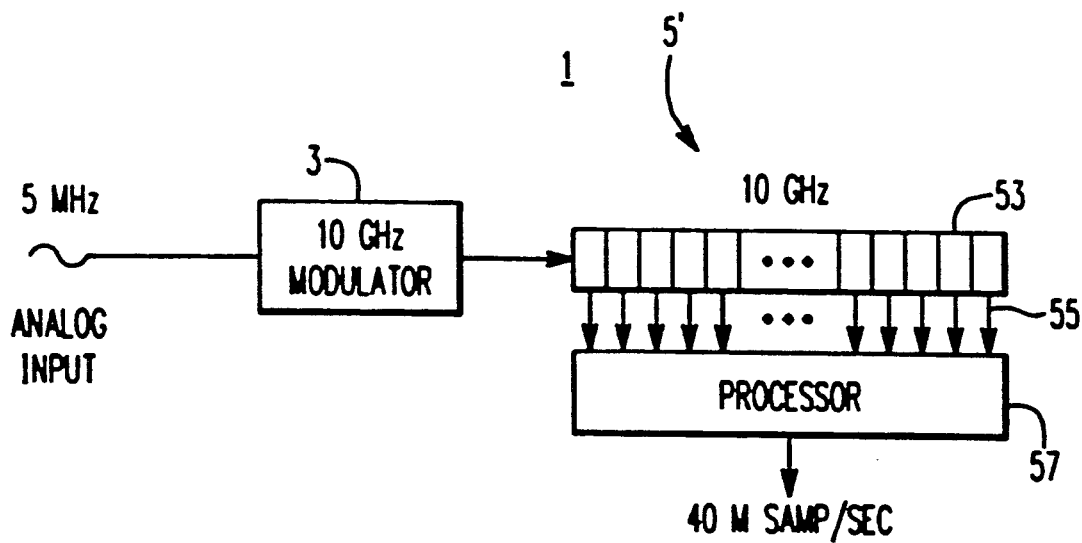
FIG. 5 is a schematic diagram of another embodiment of the sigma-delta analog-to-digital converter of the invention.

The superconducting sigma-delta analog-to-digital converter 1 of the invention comprises a superconducting sigma-delta modulator 3 and a digital filter 5 (see FIG. 5). FIG. 1 illustrates the basic configuration of the sigma-delta modulator 3 which forms the heart of the A/D converter of the invention. The analog input voltage to be converted to digital form is applied to a superconductive inductor 7. Current builds up in the inductor as the time integral of the applied analog voltage. This inductor current flows to ground through a Josephson sampling junction 9 connected in series with the inductor 7. Sampling pulses are applied to the junction 9 by a pulse generator 11. The sampling pulses generated by the pulse generator add to the inductor current flowing through the junction 9. On pulses for which the total current through the junction 9 exceeds the Josephson junction critical level, the sampling junction will emit a short voltage pulse. This voltage pulse is applied through a superconducting coupling inductor 13 across an output resistor 15. The voltage pulses appear on the output resistor 15 as a digital "1". For sampling pulses in which the critical current of the Josephson junction 9 is not exceeded, the output is a "0". Thus, the output signal appearing across the output resistor 15 is a single bit quantization of the applied analog input signal.

The voltage pulse produced by the sampling Josephson junction 9 is the size of a flux quantum (h/2e), where h is Planck's constant and e is the electron charge. On time average, the voltage pulses generated by the Josephson junction 9 in response to sampling pulses balance the input voltage, so there is no excessive build-up of current in the input inductor. As will be discussed below, the sampling pulses generated by the pulse generator 11 are very precise, so that the quantization performed by the Josephson junction 9 is very precise. It can be appreciated that should the applied analog voltage be too large, the Josephson junction 9 could generate voltage pulses independent of the sampling pulses generated by the pulse generator. This is precluded by scaling the analog voltage so that the full scale input voltage to the inductor remains below the maximum kick-back voltage available from the sampling junction 9. The Josephson voltage-to-frequency relationship specifies this ratio as 483 MHz/$\mu$V, or about 20.35 $\mu$V for 10 GHz sampling.

The pulse generator 11 comprises a two junction superconducting quantum interference device (SQUID) 17 and a pulse buffer 19. The SQUID 17 includes a current source 21 feeding a pair of series-connected Josephson junctions 23 and 25 which are shunted by superconducting inductor 27. In this known SQUID arrangement, the junction 25 generates a train of clock pulses. The pulse buffer 19 sharpens these clock pulses and protects the SQUID 17 from the kick-back pulses from the sampling junction 9. The pulse buffer 19 includes a pair of Josephson junctions 28 and 29 connected through a resistor 31 and parasitic inductance 33 to the sampling junction 9.

The pulse generated by the SQUID 17 is applied through the superconducting coupling inductor 35 to the Josephson junction 29 which generates a sharp voltage pulse which passes through the junction 28, resistor 31 and parasitic inductance 33 to the sampling Josephson junction 9. A dc bias source 37 provides some bias current to the junction 29 to assure its response to the voltage pulse from the SQUID 17. The resistor 31 prevents the flow of circulating currents. The buffer 19 not only sharpens the pulses generated by the SQUID but also prevents kick-back from the sampling Josephson junction 9 into the SQUID pulser 17.

Figure 2:
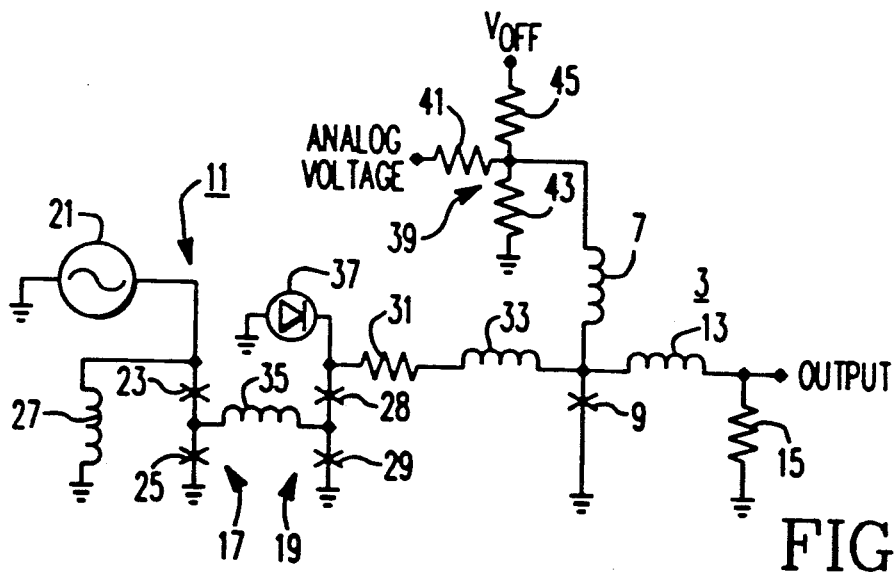
FIG. 2 is a schematic diagram of another embodiment of a superconducting sigma-delta modulator in accordance with the invention.

It is often the case that signal sources are of much higher impedance than Josephson circuits. FIG. 2 illustrates another embodiment of the invention adapted for operation with an analog current source. Like components of the modulators of FIGS. 1 and 2 are identified by like reference characters. The analog current input signal is applied through a simple resistor divider circuit 39 comprising the resistors 41 and 43.

The voltage at the top of the inductor 7 must remain positive. For ac signals, it is desirable to set the zero amplitude signal at mid-range. This can be accomplished through the injection of a suitable dc offset. The dc offset $V_{off}$ is added to the input of the modulator 3 of FIG. 2 through the resistor 45.

Figure 3:
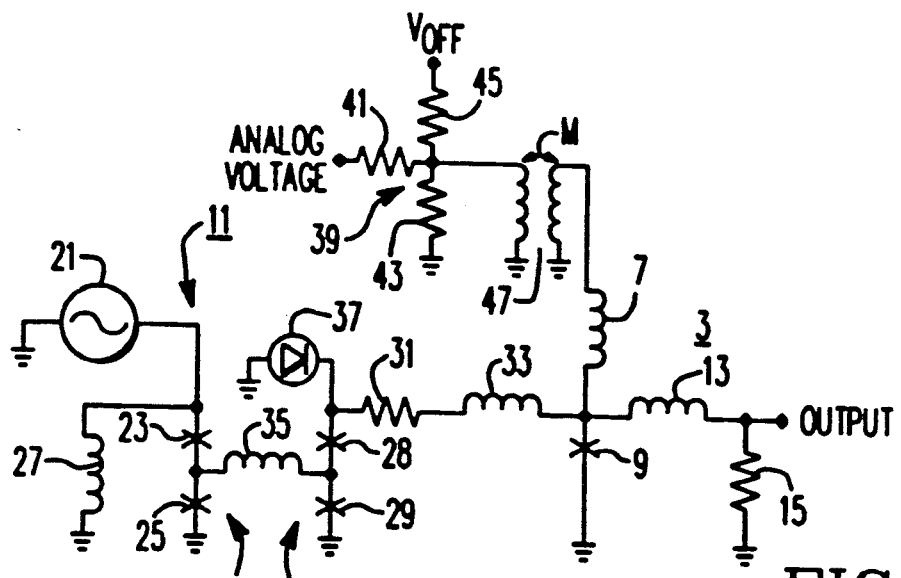
FIG. 3 is a schematic diagram of a third embodiment of a superconducting sigma-delta modulator in accordance with the invention.

As mentioned previously, the peak voltage which can be applied to the modulator 3 is limited. FIG. 3 illustrates another embodiment of the superconducting sigma-delta modulator 3 adapted for conversion of analog signals with higher peak-to-peak voltages. This modulator 3 has at its input a superconducting transformer 47. Such transformers are active at all frequencies down to and including dc. As an example, the transformer 47 could be used to match a 9-volt peak-to-peak analog input. In this instance, the transformer 47 is a 100:1 input transformer. This transformer could be made in microstrip geometry with five-micron lines on a ten-micron pitch. A single-turn secondary with a 1 mm opening would yield 10080 nH primary inductance, a 1 nH secondary inductance, 100 nH mutual inductance in a 3 mm × 3 mm square, using standard superconductive integrated circuit processing.

Figure 4:
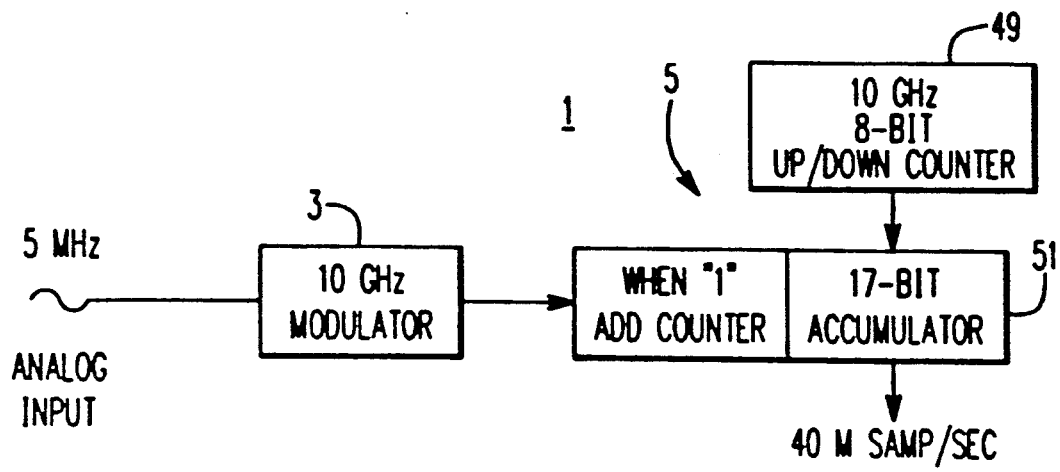
FIG. 4 is a schematic diagram of a superconducting sigma-delta analog-to-digital converter in accordance with the invention and incorporating a modulator of one of the embodiments of FIGS. 1-3.

FIG. 4 illustrates a superconducting sigma-delta analog-to-digital converter 1 which includes the superconducting sigma-delta modulator of FIGS. 1, 2 or 3 and a digital filter 5. In the example, the modulator 3 generates a 10 GHz single bit digital signal from a 5 MHz analog input signal. The digital filter 5 transforms this single bit 10 GHz digital signal into a 15 bit 40 MSamp/sec signal. The digital filter 5 is a decimator which applies triangular weighting to the transformation. The weighting function is generated by a superconducting 8 bit up/down counter 49. The counter 49 is operated at 10 GHz synchronized to the modulator 3. A 17 bit accumulator 51 adds the count in the counter to the contents of the accumulator each time the modulator 3 indicates a sample "1". Such superconductive counters have been measured at frequencies up to 120 GHz. The 40 MHz 15 bit signal (the two least significant bits of the accumulator are discarded) could be further reduced in frequency by semiconductor processors. As no additional information is contained in the 40 MHz multi-bit output signal, the signal could be reduced to the Nyquist rate or 10 MHz which could be more easily utilized by downstream circuits.

An improved arrangement for the digital filter 5 of the superconducting sigma-delta A/D converter of the invention is shown in FIG. 5. The digital filter 5' shown in FIG. 5 provides the capability for applying more complex weighting functions to the single bit digital signal generated by the modulator 3. The decimator which forms the digital filter 5' includes a Josephson shift register 53 with parallel readouts 55 which demultiplexes the 10 gigabits per second of sample data generated by the modulator 3. The number of parallel outputs 55 is equal to the modulator sampling rate divided by the desired sampling rate for the multi-bit output signal. In the example in which the desired output frequency is 40 MHz (40 MSamp/sec) the shift register 53 has 250 parallel outputs 55. Each time the shift register 53 fills up, the parallel outputs are fed to a high speed semiconductor processor 57 which decimates the digital signal to the desired output rate and applies the desired weighting function. Any desired weighting function, including complex functions such as $sinc^2$ (X) (where sinc (X) s sine $(\pi X)/\pi X$) can be applied by the processor 57. The 40 MSamp/sec 15 bit digital signal generated by the processor 57 can be further reduced, down to the Nyquist frequency, if desired, by additional semiconductor circuits.

Preliminary calculations of the performance of sigma-delta A/D conversions utilizing the Josephson electronics in accordance with the invention gave 11 to 12 bits of accuracy at 40 MHz, four times Nyquist on the 5 MHz analog input signal. Further digital post-processing could derive another bit of accuracy at Nyquist rates.

The theory of sigma-delta converters indicates a maximum possible accuracy of 15 bits for a 5 MHz bandwidth signal when sampled at 10 GHz. The preliminary calculations were for an unoptimized circuit. Adjusting circuit parameters would probably gain one or two bits.

It is also possible to gain bits by increasing the oversampling rate. Sigma-delta converters gain 1.5 bits per factor of two increase in sampling rate. Josephson shift register designs have been presented which predict rates up to 70 GHz and these could be used for data rate reduction. For instance, a 2 MHz bandwidth signal sampled at 64 GHz would be over-sampled by $2^{14} \times$ Nyquist. Optimized sigma-delta circuits are predicted to obtain 21 bits of accuracy for this case.

Sigma-delta circuits substitute high-speed digital for high precision analog components. One requirement for analog accuracy that sigma-delta A/D converters retain is feedback accuracy. A 20 bit semiconductor A/D must feed back charge to the input in parcels that are uniform to one part in $2^{20}$, that is, one ppm. All attempts to improve the accuracy of semiconductor sigma-deltas will grapple with this problem. It becomes particularly difficult to control GHz feedback to one part per million, regardless of the type of advanced semiconductor device employed. In contrast, the superconductive sigma-delta converter of the invention feeds back one flux quantum, h/2e. It is as constant and reproducible as the second and the electron charge. At the fundamental physical level, the feedback scheme of the invention relies on energy minimization of superconductive wave functions. As a practical matter, the converters of the invention use the same physical phenomena that defines the standard volt to provide stable and accurate feedback to the input.

The A/D converters of the invention are simple, but effective, implementations of sigma-delta A/D converters and superconductive circuits. Because the feedback mechanism is quantum mechanical, it is stable and accurate to a degree that cannot be achieved in semiconductor circuits. Consequently, it is anticipated that further development of circuit principles in accordance with the invention may yield A/D converters with 20+ bits of accuracy at 5 MHz.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A superconducting sigma-delta analog-to-digital converter for converting an analog input signal to a digital output signal, said converter comprising:
   a superconducting inductor to which said analog input signal is applied to produce an inductor current;
   a Josephson junction connected in series with said superconducting inductor and through which said inductor current flows;
   a pulse generator adding sampling current pulses to said inductor current to produce a total current flowing through said Josephson junction; said Josephson junction emitting a voltage pulse which reduces said inductor current in said superconducting inductor when said total current exceeds a critical current of the Josephson junction; and
   output means generating from said voltage pulses said digital output signal.

2. The converter of claim 1 wherein said output means comprises a digital filter generating a multi-bit digital output signal from said voltage pulses.

3. The converter of claim 2 wherein said digital filter comprises a decimator.

4. The converter of claim 3 wherein said voltage pulses constitute a signal bit digital representation of said analog input signal and wherein said decimator includes means applying a weighting function to said single bit digital signal in generating said multi-bit output signal.

5. The converter of claim 4 wherein said decimator comprises an up/down counter synchronized to said pulse generator and continuously generating a multi-bit count, a multi-bit accumulator having a multi-bit content which is said multi-bit digital output signal, and means adding said multi-bit count in said up/down counter to the contents of said accumulator in response to a voltage pulse from said Josephson junction.

6. The converter of claim 4 wherein said decimator comprises a superconducting shift register into which said single bit digital signal is fed at said sampling rate, said shift register having a number of bits equal to the sampling rate divided by a desired frequency of said multi-bit digital output signal, and a processor into which said bits of said shift register are fed in parallel each time said shift register is filled and which filters said bits and applies the selected weighting function thereto to produce said multi-bit output signal at said desired frequency.

7. The converter of claim 2 including a superconducting input transformer through which said analog input signal is applied to said superconducting inductor.

8. The converter of claim 2 including offset means adding a dc offset voltage to said analog input signal applied to said superconducting inductor to maintain a constant polarity of voltage applied to said superconducting inductor.

9. The converter of claim 2 wherein said pulse generator comprises a SQUID.

10. The converter of claim 9 wherein said pulse generator comprises a SQUID generating pulses at a frequency of at least 1 GHz.

11. The converter of claim 10 wherein said pulse generator includes a superconducting buffer between said SQUID and said Josephson junction.

12. A high speed sigma-delta modulator comprising:
an integrator which integrates an applied analog input signal to generate an integrated signal;
quantizer means sampling said integrated signal in response to a clock pulse signal, said quantizer means generating output pulses for samples of said integrated signal having a predetermined value and reducing said integrated signal by an amount proportional to said output pulses; and
a pulse generator-generating said clock pulse signal with a frequency of at least 1 GHz.

13. The modulator of claim 12 wherein said integrator is a superconducting inductor and wherein said quantizer means is a Josephson junction connected in series with said superconducting inductor such that induction current flows through the Josephson junction, said Josephson junction generating a voltage pulse when inductor current pulse current produced by a pulse from said pulse generator exceeds a critical current, said voltage pulse reducing current in said superconducting inductor.

* * * * *